US010365389B2

(12) United States Patent
Gilstrap et al.

(10) Patent No.: US 10,365,389 B2
(45) Date of Patent: Jul. 30, 2019

(54) MEMS-BASED TRANSDUCERS ON A DOWNHOLE TOOL

(71) Applicant: Halliburton Energy Services, Inc., Houston, TX (US)

(72) Inventors: Tatiana Gilstrap, Houston, TX (US); Yinghui Lu, The Woodlands, TX (US); John P. Granville, Humble, TX (US); Yibing Zheng, Houston, TX (US); David Alan Welsh, League City, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 211 days.

(21) Appl. No.: 15/511,868

(22) PCT Filed: Nov. 17, 2015

(86) PCT No.: PCT/US2015/061069
§ 371 (c)(1),
(2) Date: Mar. 16, 2017

(87) PCT Pub. No.: WO2017/086933
PCT Pub. Date: May 26, 2017

(65) Prior Publication Data
US 2017/0293044 A1 Oct. 12, 2017

(51) Int. Cl.
G01V 1/00 (2006.01)
G01V 1/50 (2006.01)
(Continued)

(52) U.S. Cl.
CPC ............... G01V 1/50 (2013.01); E21B 47/00 (2013.01); E21B 47/0002 (2013.01);
(Continued)

(58) Field of Classification Search
CPC ... G01V 1/50; G01V 1/46; G01V 1/52; G01V 2210/1299; G01V 2210/1429;
(Continued)

(56) References Cited

U.S. PATENT DOCUMENTS 4,832,148 A 5/1989 Becker et al.
5,105,390 A 4/1992 Husten
(Continued)

FOREIGN PATENT DOCUMENTS

WO 2010/054216 A2 5/2010
WO 2014/099786 A1 6/2014

OTHER PUBLICATIONS

International Preliminary Report on Patentability in related PCT application No. PCT/US2015/061069 dated May 31, 2018, 11 pages.

(Continued)

Primary Examiner — Krystine E Breier
(74) Attorney, Agent, or Firm — Benjamin Fite; Baker Botts L.L.P.

(57) ABSTRACT

In accordance with embodiments of the present disclosure, systems and methods for taking acoustic/ultrasonic wave measurements of a wellbore using a downhole tool equipped with microelectromechanical (MEM) transducers are provided. The MEM transducers may include a plurality of MEM transmitters (e.g., MEM speakers) and a plurality of separate MEM receivers (e.g., MEM microphones). These MEM transducers may be disposed in arrays proximate an outer surface of the downhole tool to collect acoustic/ultrasonic wave measurements of the full circumference of a wellbore. Due to their small size, large numbers of MEM transducers may be distributed radially around the downhole tool. Such an arrangement of sensors may enable the downhole tool to perform measurements of the entire wellbore (Continued)

without the downhole tool needing to be rotated, leading to an increased signal-to-noise ratio of the measurements.

20 Claims, 6 Drawing Sheets

(51) Int. Cl.
*E21B 47/00* (2012.01)
*G01V 1/46* (2006.01)
*G01V 1/52* (2006.01)
*E21B 47/10* (2012.01)

(52) U.S. Cl.
CPC ........ *E21B 47/0005* (2013.01); *E21B 47/101* (2013.01); *G01V 1/46* (2013.01); *G01V 1/52* (2013.01); *G01V 2210/1299* (2013.01); *G01V 2210/1429* (2013.01)

(58) Field of Classification Search
CPC .. E21B 47/00; E21B 47/0002; E21B 47/0005; E21B 47/101
See application file for complete search history.

(56) References Cited

U.S. PATENT DOCUMENTS

| | | | | |
|---|---|---|---|---|
| 5,877,996 | A * | 3/1999 | Krokstad | E21B 47/02 367/31 |
| 7,252,174 | B2 * | 8/2007 | Cox | G01V 1/52 181/102 |
| 7,328,620 | B2 | 2/2008 | Howard et al. | |
| 8,256,565 | B2 * | 9/2012 | Pabon | G01V 1/52 166/254.2 |
| 8,485,038 | B2 | 7/2013 | Sengupta et al. | |
| 8,812,154 | B2 | 8/2014 | Vian et al. | |
| 9,260,958 | B2 * | 2/2016 | D'Angelo | E21B 47/0002 |
| 9,534,492 | B2 * | 1/2017 | Khajeh | E21B 47/14 |
| 2005/0205268 | A1 * | 9/2005 | Engels | E21B 47/0005 166/381 |
| 2006/0137467 | A1 | 6/2006 | Horowitz et al. | |
| 2009/0013775 | A1 | 1/2009 | Bogath et al. | |
| 2009/0242317 | A1 * | 10/2009 | Tashiro | G01V 11/005 181/106 |
| 2010/0051266 | A1 | 3/2010 | Roddy et al. | |
| 2016/0245946 | A1 * | 8/2016 | Kalyanraman | E21B 47/0005 |
| 2017/0160411 | A1 * | 6/2017 | Golparian | G01V 1/168 |

OTHER PUBLICATIONS

Horowitz, Stephen, et al. A wafer-bonded, floating element shear-stress sensor using a geometric moire optical transduction technique. Florida Univ Gainesville Mechanical and Aerospace Engineering, 2007.

International Search Report and Written Opinion issued in related PCT Application No. PCT/US2015/061069 dateded Aug. 17, 2016, 15 pages.

Kim, Hye Jin, et al. "High performance piezoelectric microspeakers and thin speaker array system." ETRI journal 31.6 (2009): 680-687.

Kulka, Zbigniew. "Advances in digitization of microphones and loudspeakers." Archives of Acoustics 36.2 (2011): 419-436.

Neumann, J. J., and K. J. Gabriel. "CMOS-MEMS acoustic devices." CMOS-MEMS Wiley-VCH Verlag (2005): 193-224.

* cited by examiner

MEMS-BASED TRANSDUCERS ON A DOWNHOLE TOOL

CROSS-REFERENCE TO RELATED APPLICATION

The present application is a U.S. National Stage Application of International Application No. PCT/US2015/061069 filed Nov. 17, 2015, which is incorporated herein by reference in its entirety for all purposes.

TECHNICAL FIELD

The present disclosure relates generally to oil and gas well operations and, more particularly, to downhole tools equipped with microelectromechanical system (MEMS)-based transducers to detect wellbore properties in oil and gas wells.

BACKGROUND

Hydrocarbons, such as oil and gas, are commonly obtained from subterranean formations that may be located onshore or offshore. The development of subterranean formations and the processes involved in removing hydrocarbons from a subterranean formation typically involve a number of different steps such as, for example, drilling a wellbore at a desired well site, treating the wellbore to optimize production of hydrocarbons, and performing the necessary steps to produce and process the hydrocarbons from the subterranean formation.

Upon drilling a wellbore that intersects a subterranean hydrocarbon-bearing formation, a variety of downhole tools may be positioned in the wellbore during exploration, completion, production, and/or remedial activities. Some downhole tools are outfitted with sensors for detecting various properties of the wellbore. It is generally desirable to provide sensors in a downhole tool for detecting properties that can be used to construct high-resolution images of the wellbore, casing, and/or an annulus therebetween. In addition, it is desirable to take such sensor measurements of the entire circumference of the wellbore.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
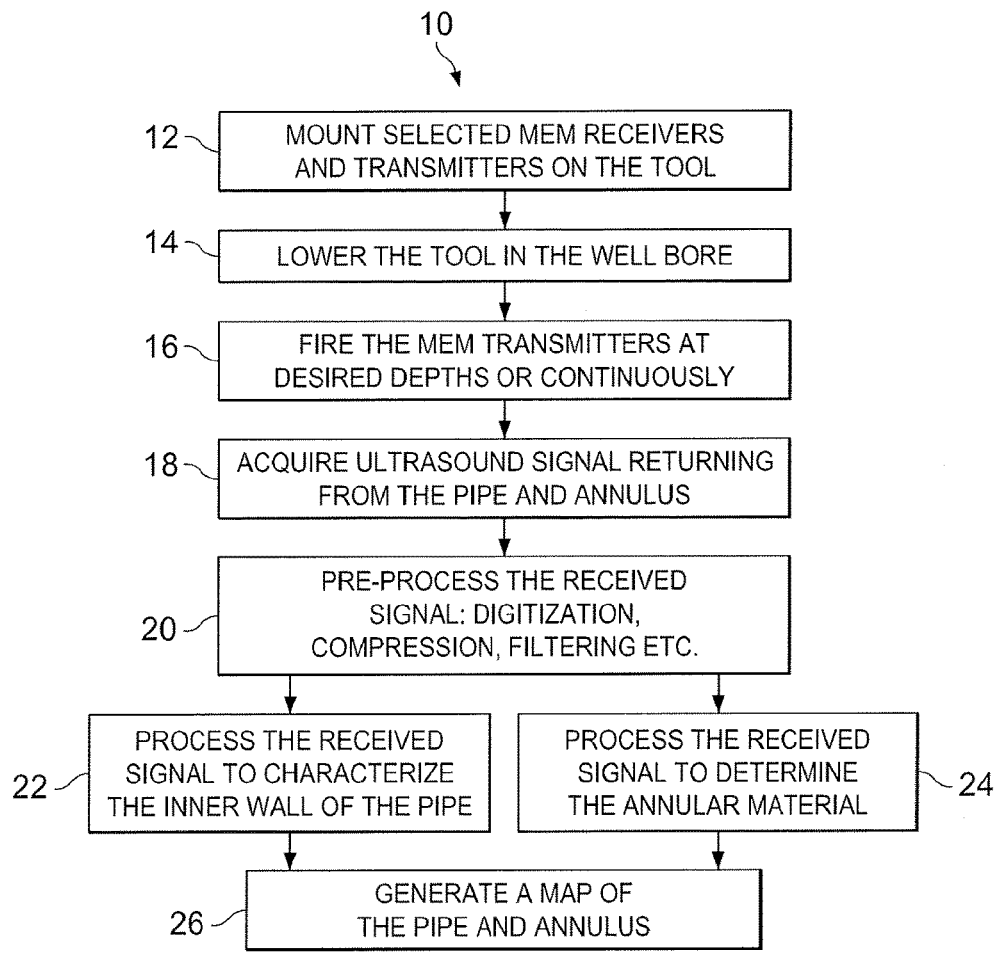
FIG. 1 is a process flow diagram of a method for taking measurements of wellbore properties using MEMS-based transducers disposed on a downhole tool, in accordance with an embodiment of the present disclosure.

Illustrative embodiments of the present disclosure are described in detail herein. In the interest of clarity, not all features of an actual implementation are described in this specification. It will, of course, be appreciated that in the development of any such actual embodiment, numerous implementation-specific decisions must be made to achieve developers' specific goals, such as compliance with system-related and business-related constraints, which will vary from one implementation to another. Moreover, it will be appreciated that such a development effort might be complex and time consuming, but would nevertheless be a routine undertaking for those of ordinary skill in the art having the benefit of the present disclosure. Furthermore, in no way should the following examples be read to limit, or define, the scope of the disclosure.

Certain embodiments according to the present disclosure may be directed to systems and methods for taking acoustic/ultrasonic wave measurements of a wellbore. These measurements are currently performed in a wellbore using macro-sized piezoelectric transducers disposed in a downhole tool. These transducers are generally large components that include both a transmitter for outputting acoustic/ultrasonic waves toward the wellbore and a receiver for detecting reflections of these waves off the wellbore. These piezoelectric transducers typically also feature a backing element mounted behind the transmitter and receiver, to help attenuate waves moving through the back of the transducer. The backing element further increases the dimensions of the macro-sized transducer. Due to the relatively large dimensions of these transducers, it can be difficult to position and incorporate a large number of the transducers into a downhole tool to perform the desired measurements.

In addition, currently used transducers have to be positioned within a downhole tool such that a certain minimal distance (i.e., "standoff") is maintained between the transducer and the wall of the wellbore. Due to the size and standoff requirements mentioned above, any downhole tool equipped with one or more of these macro-sized transducers must be rotated in the wellbore to provide acoustic/ultrasonic measurements covering the full circumference of the wellbore.

To overcome these drawbacks, present embodiments are directed to a system and method for taking acoustic/ultrasonic wave measurements of a wellbore using a downhole tool equipped with microelectromechanical system (MEMS) based transducers. The MEMS based transducers may include a plurality of microelectromechanical (MEM) transmitters (e.g., MEM speakers) and a plurality of separate MEM receivers (e.g., MEM microphones). These MEMS-based transducers may be disposed in arrays proximate an outer surface of the downhole tool to collect acoustic/ultrasonic wave measurements of the full circumference of a wellbore.

"MEMS" as disclosed herein may refer to microelectromechanical systems or components having dimensions within a range of approximately 100 nanometers to 1 millimeter. MEMS technology has applications in telecommunications, the automotive industry, and hearing aids, among others. MEMS may be used to perform functions individually or in combination with other devices to generate macro-scale effects.

By utilizing MEM transducers in downhole tools to perform acoustic/ultrasonic measurements, the disclosed embodiments may provide several advantages over currently used macro-sized transducers. First, the MEM transducers are relatively smaller in size, lightweight, and have a lower power consumption compared to macro-scale transducers. The small size of the MEM transducers (i.e., MEM transmitters and receivers) may allow for on-chip signal processing and relatively cheap manufacturing using batch processing techniques (e.g., similar to those used for semiconductor integrated circuits). In addition, the small size of the MEM transducers may allow each MEM array to be configurable or custom designed to fit the objectives of a certain logging operation. The low power of the MEM arrays may allow more tool components to be added to a downhole tool string in addition to the sensor arrays. The low power consumption of the disclosed devices may therefore save time, manpower, and money for performing logging operations.

Acoustic MEM devices may cover a range of frequencies including audible and ultrasonic frequencies. These acoustic MEM components (i.e., transmitters and receivers) may be particularly useful in applications where the small size of the MEM components is comparable to the wavelength of sound detected, therefore allowing for high resolution imaging of structures. This allows the MEM transducers used in the disclosed embodiments to perform higher resolution imaging of a wellbore, casing, and annulus disposed therebetween, due to the smaller size of the transducers.

Due to their small size, large numbers of MEM transducers (i.e., transmitters and receivers) may be distributed radially around the downhole tool. Such an arrangement of sensors may enable the downhole tool to perform measurements of the wellbore without the downhole tool needing to be rotated. By eliminating rotation of the downhole tool, the MEM transducer arrays may lead to reduced acoustic noise that might otherwise be generated by a mechanically-driven, rotating motor. This reduced noise may increase the signal-to-noise ratio (SNR) of measurements taken by the disclosed transducer arrays. Thus, the arrays of multiple MEM transducers disposed around the circumference of the downhole tool may lead to higher resolution images of the wellbore, casing, and annulus. In addition, multiple MEM transducers disposed in arrays on the downhole tool may enable the tool to perform more complicated and targeted measurements within the wellbore.

Moreover, the MEM transducers may enable wellbore and pipe evaluation in smaller diameter wellbores, since the disclosed downhole tool does not need to be rotated and, therefore, the mechanical assembly of the tool with the transducers may be smaller.

Turning now to the drawings, FIG. 1 is a process flow diagram of a method 10 for enabling evaluation of a wellbore via MEM transducers in accordance with presently disclosed techniques. The term "wellbore" used herein may refer to either a cased wellbore or an uncased wellbore. In a cased wellbore, the measurements provided by the MEM transducers may enable evaluation of an inner wall of the casing and/or an annulus between the casing and the inner wall of the formation through which the wellbore was drilled. In an uncased wellbore, the measurements may enable evaluation of an inner wall of the wellbore formed through the formation.

The method 10 may include mounting (block 12) MEM transducers on the downhole tool. The MEM transducers may be mounted onto the downhole tool as separate groups of MEM receivers and MEM transmitters. The small size of the MEM transducers allows for the transducers to be positioned and mounted onto the downhole tool as arrays. Consequently, array processing techniques may be used to detect one or more wellbore parameters based on the measurements from the MEM transducers.

In the disclosed method 10, the transducers may include MEM transmitters and MEM receivers that are mounted separately to the downhole tool. That is, the MEM transmitters and MEM receivers are disposed separately from each other on the downhole tool, instead of within a single transducer component or housing. In ultrasonic transducers currently used downhole, the transmitter and receiver portions of the transducer are packaged in the same housing. As a result, these transducers generally feature a backing material used to attenuate "ring down" from the signal output from the transmitter. In presently disclosed embodiments, however, such "ring down" is not an issue because the MEM transmitter components and the MEM receiver components are separate from each other. Thus, the disclosed MEM transducer arrays may have less ringdown noise than currently used macro-scale transducers. In addition, the disclosed MEM transducer arrays do not require additional backing material, thus saving a large amount of room within the downhole tool that would otherwise be occupied by the backing material in macro-scale transducers.

The MEM transmitters and MEM receivers may be mounted to the downhole tool in any desirable configuration. Several examples of different arrangements and placements of the MEM transmitters and receivers are discussed below with reference to FIGS. 2A-2E and 3A-3C. For example, the MEM transmitters and receivers may be mounted directly to an outer surface of the downhole tool (e.g., FIG. 2A) or to extendable arms that can be used to position the transmitters and receivers away from the outer surface (e.g., 2B). The MEM transmitters and receivers may be mounted to the downhole tool in certain orders of arrays (e.g., FIGS. 2C and 2D) or in a randomized arrangement (e.g., 2E). The MEM transmitters and MEM receivers may be mounted to the downhole tool in arrays that are linear (e.g., FIG. 3A) or two-dimensional (e.g., FIGS. 3B and 3C). The mounting arrangements described in detail below with reference to FIGS. 2A-2E and 3A-3C may be applied to both the MEM transmitters and the MEM receivers.

In some embodiments, the method 10 may also include applying a protective coating or positioning a protective sleeve over the MEM transmitters and MEM receivers mounted to the downhole tool, to protect the MEMS-based sensing components from the downhole environment. The protective coating or sleeve may be made from any desirable protective material such as, for example, rubber or polyether ether ketone (PEEK). It may be desirable for the protective material of the coating or sleeve to have the same or a similar impedance to the drilling mud that will be circulated between the downhole tool and the wellbore. That way, any signals output from the MEM transmitters may travel consistently through the coating/sleeve and the drilling mud without reflecting signals back to the separate MEM receivers until the signals reach a boundary of the wellbore (i.e., casing wall or formation wall).

In other embodiments, the method 10 may include mounting the MEM transmitters and receivers such that they are recessed at least slightly into an inner portion of the downhole tool. This may provide protection to the MEMS-based sensing components from the downhole environment through which the downhole tool may be moved.

Figure 4:
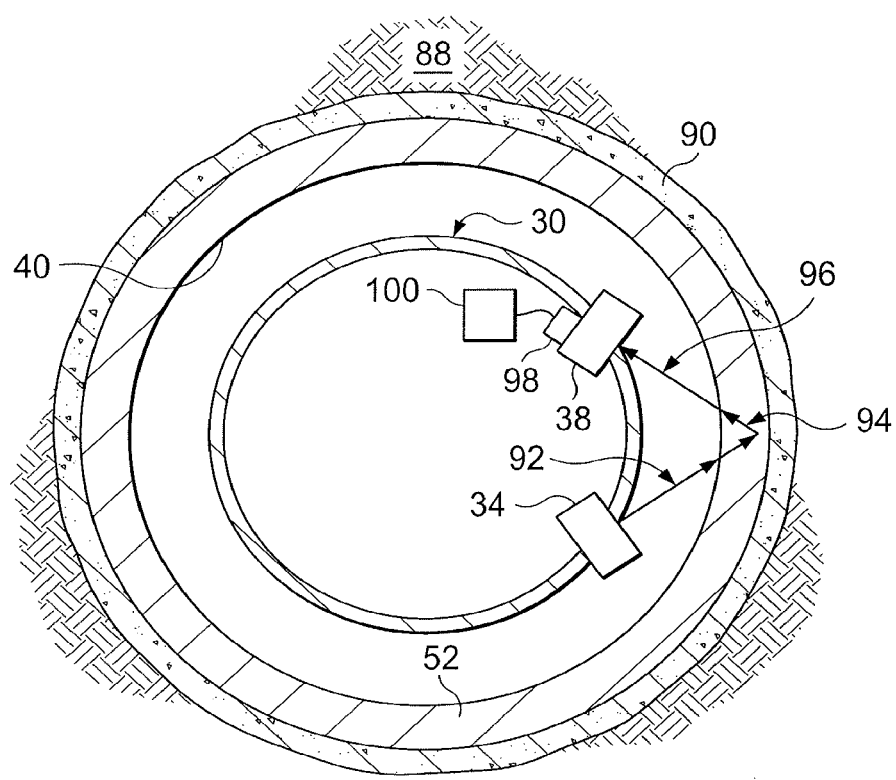
FIG. 4 is a schematic view of a wave path from a MEM transmitter to a casing and reflected back to a MEM receiver, in accordance with an embodiment of the present disclosure.

With the multiple MEM transmitters and MEM receivers mounted onto the downhole tool, the downhole tool may than be lowered (block 14) into a wellbore. The method 10 may then include firing (block 16) the MEM transmitters on the downhole tool. The transmitted signals may travel from one or more MEM transmitter arrays, through the fluid in the wellbore, and to a wall of the wellbore or a pipe (i.e., casing) disposed in the wellbore, as shown in FIG. 4.

The method 10 may then include acquiring (block 18), via one or more MEM receivers on the downhole tool, the acoustic or ultrasonic signal returning from (i.e., reflected off) the formation, casing, and/or an annulus between the formation and casing. The received signals detected by the one or more receivers may then be pre-processed (block 20). This pre-processing may be accomplished via a circuit coupled to or incorporated with the one or more MEM receivers. The pre-processing may include steps such as digitizing, compressing, and/or filtering the signals from one or more MEM receivers so that they can be provided to a controller for further processing.

The method 10 may then involve the application of various array processing algorithms to determine one or more properties of the wellbore. For example, a controller may process (block 22) signals provided from one or more MEM receivers via an algorithm to generate images of the inner wall of the wellbore/casing. In some embodiments, the inner wall may include a wall where the wellbore extends through the formation. In other embodiments, the inner wall may include an inner wall of casing or some other pipe disposed through the wellbore. In still other embodiments, the controller may process (block 24) signals provided from one or more MEM receivers via an algorithm to determine whether there is fluid or some other material located in a cemented annulus between the formation and the casing. The controller may control operation of the MEM transmitters to output one or more acoustic or ultrasonic signals and of the MEM receivers to detect at least a portion of the one or more signals, and this process may be repeated multiple times while the downhole tool is raised or lowered through the wellbore. In addition, these measurements may be taken to determine properties of the wellbore around a full circumference of the wellbore while the downhole tool is maintained at approximately the same orientation about it's a longitudinal axis (i.e., not rotated).

The final output of the processing techniques may include a map (block 26) of the wellbore. This may include a map of just a wellbore wall in an uncased well, or both the casing and the annulus (between the casing and the formation) in a cased well. The map may be generated based on various attributes extracted from the one or more signals received at the MEM receivers. These attributes may include, for example, arrival time, amplitude, impedance, semblance, attenuation, and compressional-to-shear velocity ratio (Vp/Vs) of the received signals.

In some embodiments, the MEM transducers and associated processing techniques may be used to provide other measurements or determine other wellbore properties. For example, the MEM transducer arrays may be used to measure or evaluate a cement bond quality of a cased section of the wellbore. The detected signals may be processed to determine the presence of irregularities on the inside of the pipe, top of the cement, channels in the cement, and fluids in the cement. Using this information, a controller may determine a cement bond log for the wellbore. The cement bond log may be provided for wellbores utilizing all types of cements, including foam cements. In addition, the MEM transducers and processing techniques may be used to determine a borehole ultrasonic energy or to provide caliper measurements.

The signal-to-noise ratio (SNR) of the detected wellbore properties may be improved using the disclosed systems and methods. For example, the use of array processing techniques may help to improve the SNR since signals from multiple receivers may be filtered and used in combination to determine the various wellbore properties. In addition, the use of multiple MEM transmitters and receivers disposed all around the downhole tool may allow the downhole tool to collect information on all sides of the wellbore without rotating the downhole tool within the wellbore. Thus, the non-rotating tool may prevent or reduce an amount of mechanical noise induced in the MEM transducer signals.

Figure 2A:
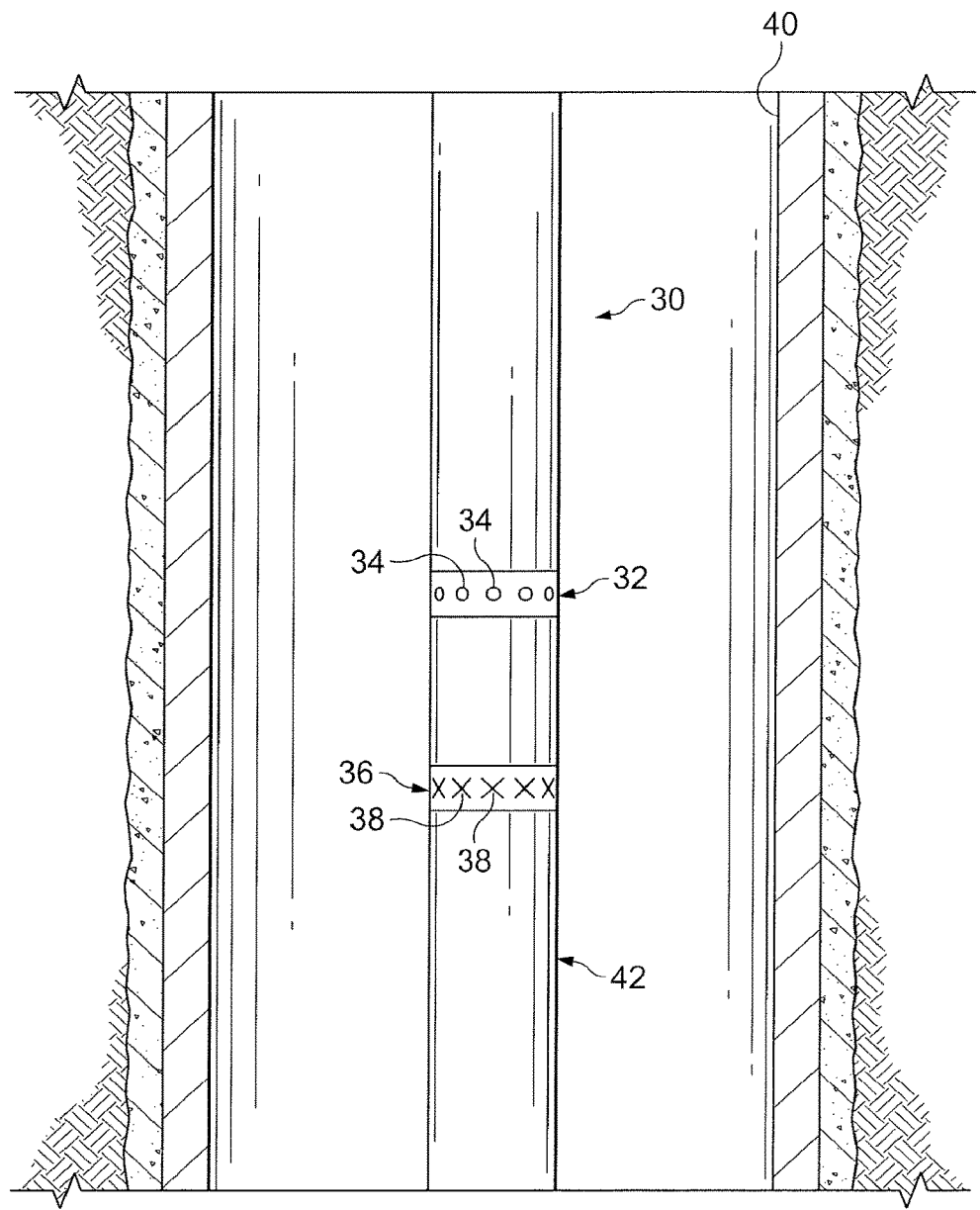
FIGS. 2A-2E are schematic views of downhole tools equipped with different arrangements of microelectromechanical (MEM) transmitters and MEM receivers, in accordance with an embodiment of the present disclosure.

Having described a general method for determining wellbore properties using the disclosed MEM transducers disposed on a downhole tool, several embodiments of the downhole tool itself will now be described. FIGS. 2A-2E and FIGS. 3A-3C illustrate different arrangements for the MEMS-based sensing components that may be mounted to a downhole tool 30. For example, FIG. 2A illustrates an array 32 of MEM transmitters 34 and an array 36 of MEM receivers 38 that are mounted to the downhole tool 30 positioned within a wellbore 40. As shown, the array 32 of MEM transmitters 34 may be disposed on a first circumferential band around the downhole tool 30, while the array 36 of MEM receivers 38 is disposed on a second circumferential band around the downhole tool 30. The first and second circumferential bands defining the two arrays 32 and 36, respectively, may be offset along a longitudinal axis of the downhole tool 30. In the illustrated embodiment, the MEM transmitters 34 and receivers 38 may be mounted directly onto an outer surface 42 of the downhole tool 30.

Figure 2B:
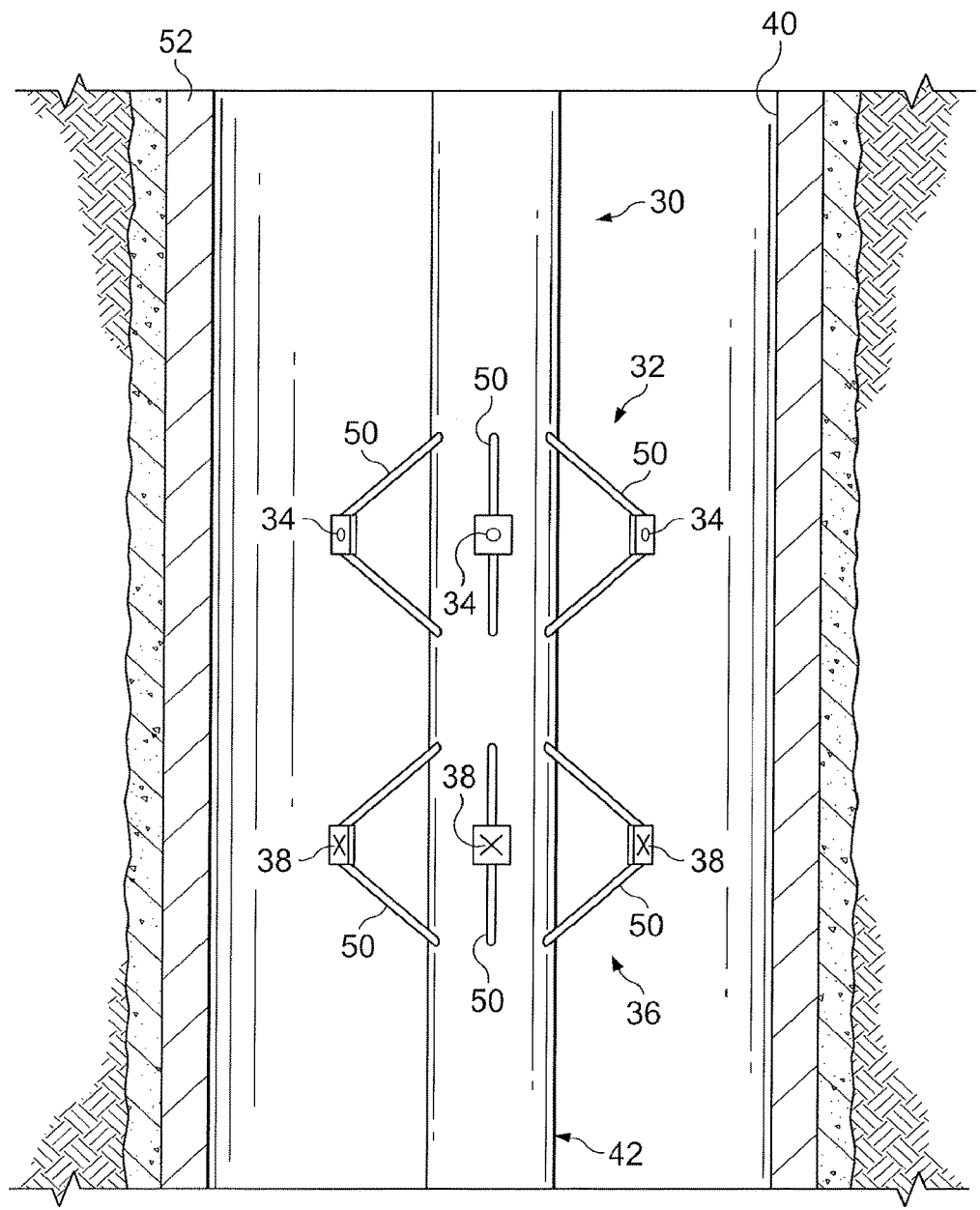

FIG. 2B illustrates another embodiment of the downhole tool 30, wherein the MEM transmitters 34 and MEM receivers 38 may be mounted onto arms 50 that are selectively extendable away from the outer surface 42 of the downhole tool. The arms 50, as illustrated, may include pads upon which the MEM transmitters 34 and/or MEM receivers 38 are mounted. The arms 50 may also include mechanical linkages that can be selectively actuated to extend the pads away from the outer surface 42 of the downhole tool 30, or back towards the outer surface 42. These arm assemblies 50 may be used to place the MEM transmitters 34 and MEM receivers 38 at a desired distance from the wellbore 40. For example, in the illustrated embodiment, the wellbore 40 may feature a casing 52 disposed therein, and the arms 50 may be used to bring the MEM transducers close to the casing 52 for performing desired evaluations of the cased wellbore 40.

In the illustrated embodiment, the pads of the arms 50 may each include a single MEM transmitter 34 or MEM receiver 38. However, other embodiments may include multiple MEM transmitters 34, MEM receivers 38, or both disposed on a single pad of an extendable arm 50. As shown, the pads of the arms 50 may be oriented such that they are parallel with a longitudinal axis of the downhole tool 30 and/or the wellbore 40, although other arrangements and orientations of the arms 50 may be utilized in other embodiments.

The arms 50 may enable a reduction in attenuation of the acoustic/ultrasonic waves communicated between the MEM transmitters 34 and receivers 38. In wellbore environments where the fluid in the wellbore 40 (e.g., drilling mud, etc.) is heavy and oil-based, for example, the drilling mud might cause attenuation in the waves communicated via the transmitters/receivers. By moving the transmitters 34 and receivers 38 closer to the wall of the wellbore 40 and/or casing 52, the arms 50 may enable a reduction in the amount of attenuation of acoustic/ultrasonic waves used to perform the sensing operations.

In some embodiments, the arms 50 may be controlled to move away from the outer surface 42 of the downhole tool 30 or back toward the outer surface 42 as desired. The controlled movement of the arms 50 may be used to position the MEM transmitters 34 and receivers 38 at a desired standoff distance from the wellbore 40 and/or casing 52. In some embodiments, the arms 50 may be controlled to bring the MEM transmitters 34 and receivers 38 into direct contact with the casing 52 in the wellbore 40, to perform measurements indicative of certain wellbore properties.

Figure 2C:
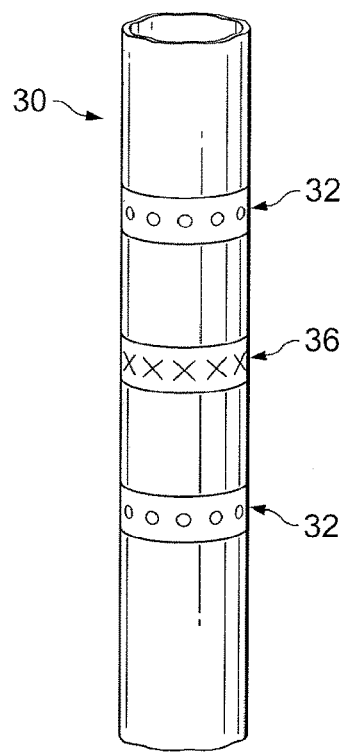
Figure 2D:
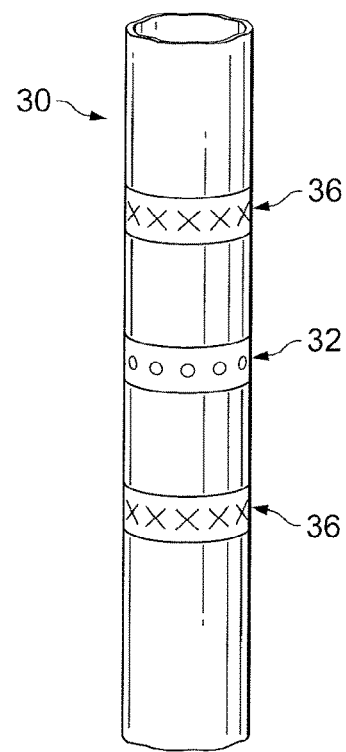

Different combinations and arrangements of MEM transmitters 34 and MEM receivers 38 may be used on the downhole tool 30 to perform acoustic/ultrasonic measurements. For example, the transmitters 34 may be disposed in arrays 32 positioned above, below, or on both sides of an array 36 of the receivers 38. Similarly, the receivers 38 may be disposed in arrays 36 positioned above, below, or on both sides of an array 32 of transmitters 34. FIG. 2C illustrates an embodiment of the downhole tool 30 where one MEM receiver array 36 is mounted between two MEM transmitter arrays 32. A reversed configuration is shown in FIG. 2D, where the downhole tool 30 features one MEM transmitter array 32 mounted between two MEM receiver arrays 36.

Figure 2E:
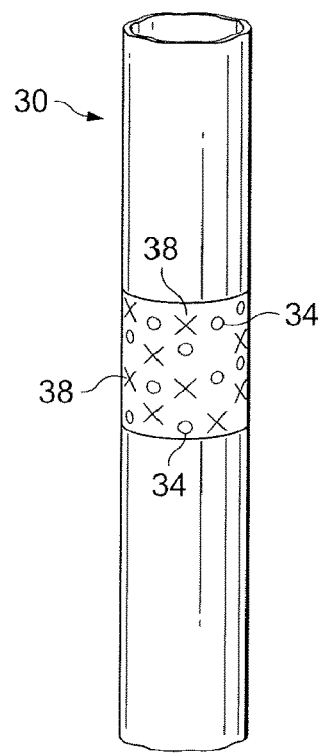

In still other embodiments, the MEM transmitters 34 and receivers 38 might not be arranged in discrete arrays at all. Instead, as shown in FIG. 2E, the MEM transmitters 34 and receivers 38 may be interspersed amongst each other and/or randomized within the same circumferential band around the downhole tool. In such embodiments, a controller may operate the MEM transmitters 34 and receivers 38 with configurable timing to perform a desired measurement. Such a randomized arrangement of MEM transmitters 34 and receivers 38 may lead to lower signal noise levels within the detected measurements.

Figure 3A:
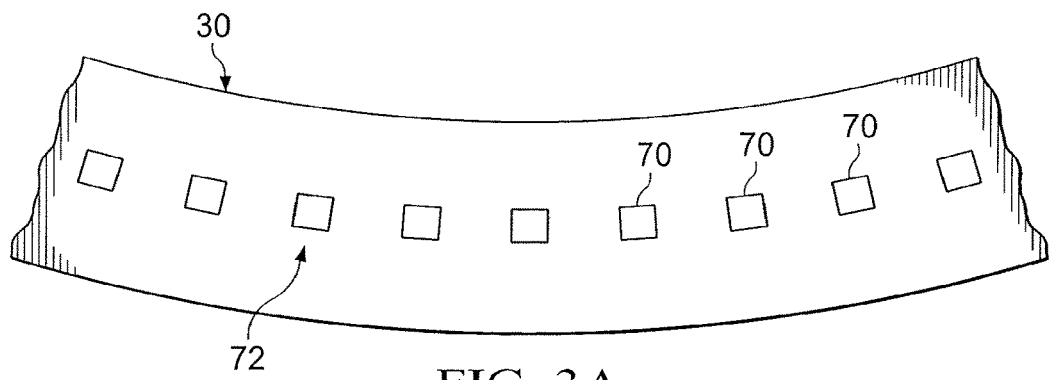
FIGS. 3A-3C are schematic diagrams illustrating different arrangements of radially mounted MEM transducer arrays, in accordance with an embodiment of the present disclosure.
Figure 3B:
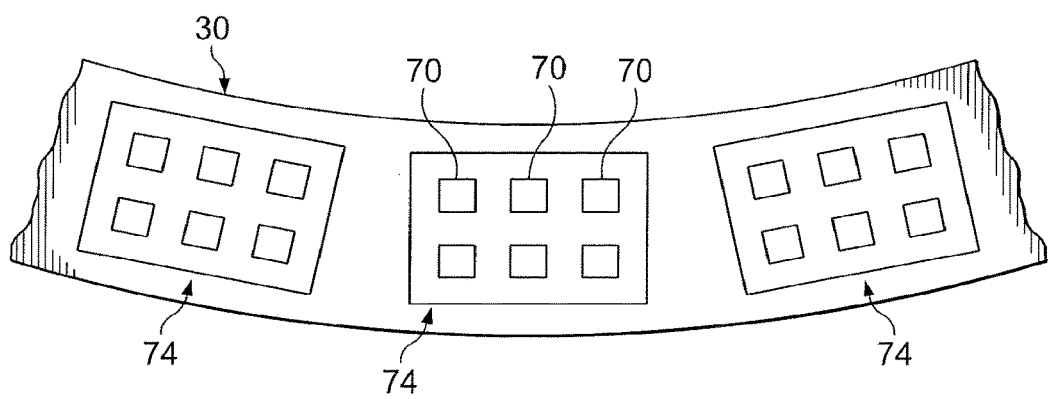
Figure 3C:
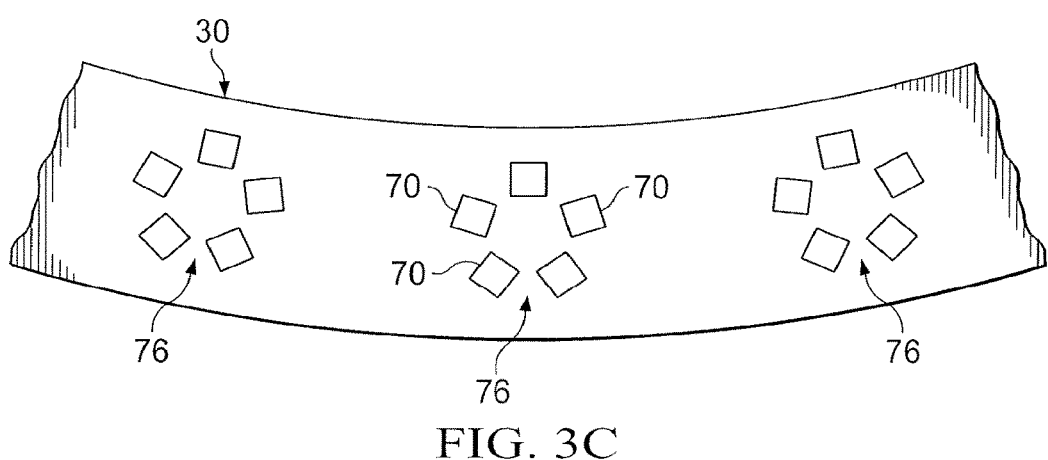

Having disclosed different relative arrangements of circumferential arrays of MEM transmitters 34 and receivers 38 about the downhole tool 30, various arrangements of the transmitters 34 and receivers 38 within their respective arrays 32 and 36 will now be described with reference to FIGS. 3A-3C. It should be noted that any desirable size, shape, or geometry of arrays of transducer elements may be used on the downhole tool 30. For example, FIG. 3A shows a plurality of MEM transducer elements 70 (e.g., transmitters, receivers, or both) that are assembled in a linear array 72 that extends radially around the downhole tool 30. FIG. 3B shows individual MEM transducer elements 70 arranged into multiple rectangular arrays 74. These multiple arrays 74 may be positioned radially about the downhole tool 30. Similarly, FIG. 3C shows individual MEM transducer elements 70 arranged into multiple circular arrays 76, these circular arrays 76 being positioned radially about the downhole tool 30. In both arrangements of radially positioned transducer element arrays (e.g., FIGS. 3B and 3C), each array 74 and 76 may be controlled to help determine a wellbore property at a different circumferential location around the wellbore.

FIG. 4 is a schematic view of a wave path through which an acoustic/ultrasonic signal may pass from the MEM transmitter 34 on the downhole tool 30 to a casing pipe and then to the MEM receiver 38. As illustrated, in this embodiment, the downhole tool 30 may be positioned within the wellbore 40 formed through a formation 88, and the wellbore 40 may be cased (i.e., casing 52). The casing 52 may be cemented into place against the formation 88 via cement disposed in an annulus 90 between the casing 52 and the formation 88.

When the MEM transmitter 34 fires the initial acoustic/ultrasonic signal, the signal may pass through the wellbore fluid within the space between the downhole tool 30 and the casing 52 as an incident wave 92. Upon the incident wave 92 reaching the casing 52, a relatively large fraction of the incident energy of the wave 92 may be reflected back to the downhole tool 30 due to the impedance contrast between the wellbore fluid and the steel casing 52. A smaller fraction of the incident energy may be transmitted into the casing 52 as a wave 94. This small fraction of energy in the wave 94 may undergo additional partitioning at the pipe-cement interface (annulus 90) due to the impedance contrast between the steel casing 52 and the material in the annulus 90.

The MEM receiver 38 may then capture a returning signal 96 reflected back through the casing 52. The returning signal 96 may carry information about various properties of the casing 52 and the annulus 90. As illustrated, the MEM receiver 38 may then communicate the received returning signal 96 to a processor 98 for performing pre-processing on the signal. As described above with respect to the method of FIG. 1, the pre-processing may include digitization, compression, and/or filtering of the signal. Upon completion of the pre-processing, the processor 98 may then communicate the pre-processed signal to a control/processing component 100 for evaluation and determination of one or more properties of the wellbore 40 (i.e., the casing 52 and/or annulus 90). In some embodiments, the control/processing component 100 may also be communicatively coupled to the one or more MEM transmitters 34 to control the signal(s) output from the transmitters 34 to perform a desired measurement.

As illustrated in FIGS. 2A-2E, the MEM transducer components (e.g., transmitters 34 and receivers 38) may be positioned around the entire circumference of the downhole tool 30. Because of this circumferential arrangement, the downhole tool 30 does not have to be rotated within the wellbore 40. As a result, the downhole tool 30 may not perturb the wellbore environment (e.g., drilling mud disposed inside the wellbore 40 or casing 52). If the drilling mud in the wellbore 40 is very oily, viscous, and/or heavy, any rotation of the downhole tool could lead to a disturbance in the mud, causing additional mechanisms of signal attenuation (particularly in high frequency measurements). Accordingly, the radially disposed arrangement of MEM transmitters 34 and receivers 38 may facilitate more accurate measurements since the downhole tool 30 does not need to be rotated to determine properties around the entire circumference of the wellbore.

The MEM receivers 38 disclosed herein may function as MEM microphones in various fields. Due to their small size, the MEM receivers 38 may be assembled in large arrays of any desirable aperture or geometry.

As shown in FIGS. 3A-3C, the MEM receivers (i.e., MEM transducer elements 70 of the relevant figures) may be positioned in arrays around the downhole tool 30. Using arrays of receivers instead of individual receivers may be particularly desirable for a number of reasons. First, the arrays allow for improving the SNR of signal measurements due to time stacking, which leads to suppression of incoherent noise. Thus, an array of MEM receivers may be used to detect relatively weak acoustic signals, since the high SNR may allow the pre-processing components to filter out inaccurate measurements. In addition, the arrays may be used for suppression of coherent noise as a result of selecting an appropriate spatial distribution of the array elements 70 to suppress undesired noise frequencies. Further, the arrays may provide signal measurements that can be used to estimate or determine a directivity of the incoming signal based on the information captured for the acoustic field in three dimensions.

For the purposes of evaluating the casing 52 and the annulus 90 of FIG. 4, being able to use arrays 36 of the MEM receivers 38 may enable an improved SNR over currently used macro-scale transducers. In addition, the MEM receiver arrays 36 may enable the use of array processing methods to evaluate and provide three-dimensional imaging to investigate multiple layers of the wellbore 40 (e.g., casing 52, annulus 90, and formation 88). These processing methods may include, for example, semblance-based imaging, beamforming, slant stacks, vespagrams, and others. Moreover, three-dimensional MEM receiver arrangements may allow for an acquisition of shear waves generated and transmitted through the wellbore environment.

The MEM transmitters 34 disclosed herein may operate with limited power individually. However, when arranged and programmed to operate together in an array, the transmitters 34 may produce a sound of intensity comparable to that of the incident sound wave from a macro-sized transducer. Thus, the arrays 32 of transmitters 34 mounted to the downhole tool 30 disclosed herein may achieve an appropriate uniformity in the production of transmitted incident signals 92.

The amplitude of the sound emitted by one or more arrays 32 on the downhole tool 30 may be controlled by controlling the number of elements disposed in the MEM transmitter arrays 32. As long as the MEM transmitters 34 disposed in a given array 32 have relatively similar signal responses, the net response of the array 32 may be the accumulation of pressures from the individual transmitters 34. Thus, the arrays 32 may be used to generate specially designed acoustic waveforms with easy controls of both the frequencies of waves output from the transmitters 34 and the propagation directions of these waves.

The use of MEMS-based transmitters 34 within the downhole tool 30 may enable the output of waves from the transmitters 34 into oblique incidence with the casing 52 and/or the wellbore 40, as shown in FIG. 4. The term "oblique incidence" may refer to the incident wave 92 reaching a boundary (e.g., casing wall, annulus, etc.) at an oblique angle relative to the boundary (i.e., not parallel or perpendicular to the boundary). In existing systems, when a single transducer that includes both an emitter and receiver element is used, the output wave must be reflected directly back to the transducer, such that oblique incidence is not available. However, in presently disclosed embodiments, the separate MEM transmitters 34 and receivers 38 may be positioned to enable transmission of such waveforms into oblique incidence with the wellbore 40.

The oblique incidence available through the use of disclosed MEM transducer elements on the downhole tool 30 may allow for energy partitioning into both compressional and shear waves for data collection and measurements. That is, the three-dimensional arrangement of transducers (i.e., 34 and 38) may enable acquisition of both compressional (P) and shear (S) waves. The ability to generate shear waves is important as such waves may be sensitive to the presence of fluids in the annulus 90 and, therefore, can be measured to determine whether fluids or other materials are in the annulus 90. The compressional waves can move through fluid, but shear waves cannot move through fluid. Accordingly, the incident wave 92 of FIG. 4 may originally be transmitted from the MEM transmitter 34 as a compressional wave. The incident wave 92 comes into contact with the casing 52 at an angle, such that a portion of energy is reflected back in compressional and shear wave components and another portion of energy moves through the casing 52 as compressional and shear wave components. The angle of incidence of the transmitted signal may be designed to generate a maximum amount of shear energy behind the casing 52.

By detecting the amount of shear energy that is reflected back in the returning signal 96, the controller may utilize this value to determine whether fluid is present in the annulus 90 (where the cement bond is located) between the casing 52 and the formation 88. More specifically, processing methods such as determining the Vp/Vs ratio (ratio of compressional to shear wave velocity) may be applied to the detected signals to identify whether fluids are present in the annulus. If fluid is detected in the annulus 90, this may indicate partially debonded cement or fully debonded cement. The determined amount of shear energy reflected back to the receiver 38 may be used to determine whether the cement is well-bonded within a range of expected impedances for the particular wellbore 40.

When MEM transmitters 34 are mounted circumferentially around the downhole tool 30, as shown in FIGS. 2A, 2C, and 2D, the phase of the waves emitted from each individual transmitter 34 may be controlled to form an acoustic beam that scans the inner wall of the wellbore 40. Thus, the phases of signals emitted from the MEM transmitters 34 can be changed so that the output energy scans the entire circumference of the wellbore 40.

Another application of the multiple MEM transmitters 34 is focusing the energy from the transmitter array 32. Such focusing of the emitted signals may transmit more energy into particular layers of interest of the borehole (e.g., casing 52, annulus 90). This may result in a stronger reflection of signals received from those layers. In some embodiments, the focused beam available through controlling signals emitted from the transmitters 34 may be used to target various layers of the wellbore individually. That is, the MEM array elements may be adjusted individually to focus on different depths of penetration into the casing 52 and the annulus 90. In embodiments where the casing thickness may vary, this changing of the focus may allow the downhole tool 30 to track the thickness, and generate a map, of the casing.

Embodiments disclosed herein include:

A. A system including a downhole tool, a plurality of microelectromechanical (MEM) transmitters, and a plurality of MEM receivers. The plurality of microelectromechanical (MEM) transmitters are disposed proximate an outer surface of the downhole tool for outputting one or more acoustic or ultrasonic signals toward a wellbore. The plurality of MEM receivers are disposed proximate the outer surface of the downhole tool for receiving a portion of the one or more acoustic or ultrasonic signals reflected back from the wellbore.

B. A method including outputting one or more acoustic or ultrasonic signals toward a wellbore via a plurality of microelectromechanical (MEM) transmitters disposed proximate an outer surface of a downhole tool. The method also includes detecting at least a portion of the one or more acoustic or ultrasonic signals reflected back from the wellbore via a plurality of MEM receivers disposed proximate the outer surface of the downhole tool. The method further includes processing the detected portion of the one or more acoustic or ultrasonic signals to determine a property of the wellbore via a processing component communicatively coupled to the plurality of MEM receivers.

Each of the embodiments A and B may have one or more of the following additional elements in combination. Element 1: wherein the plurality of MEM transmitters, the plurality of MEM receivers, or both are coupled directly to the outer surface of the downhole tool. Element 2: wherein the plurality of MEM transmitters, the plurality of MEM receivers, or both are mounted on mechanical arms that are selectively extendable away from the outer surface of the downhole tool. Element 3: wherein the plurality of MEM transmitters are disposed on a first circumferential band around the downhole tool, the plurality of MEM receivers are disposed on a second circumferential band around the downhole tool, and the first and second circumferential bands are offset along an axis of the downhole tool. Element 4: wherein the plurality of MEM transmitters and the plurality of MEM receivers are randomly interspersed amongst each other on the downhole tool. Element 5: wherein the plurality of MEM transmitters, the plurality of MEM receivers, or both are disposed in a linear arrangement that extends radially around the downhole tool. Element 6: wherein the plurality of MEM transmitters, the plurality of MEM receivers, or both are disposed in circular arrays, the circular arrays being positioned radially around the downhole tool. Element 7: wherein the plurality of MEM transmitters, the plurality of MEM receivers, or both are disposed in rectangular arrays, the rectangular arrays being positioned radially around the downhole tool. Element 8: further including a processing component for determining properties of the wellbore based on one or more acoustic or ultrasonic signals detected at the plurality of MEM receivers. Element 9: wherein the MEM transmitters and the MEM receivers are disposed around a circumference of the downhole tool to enable detection of wellbore properties without the downhole tool rotating in the wellbore. Element 10: further including a protective coating disposed over one or more of the plurality of MEM transmitters and plurality of MEM receivers. Element 11: wherein plurality of MEM transmitters and the plurality of MEM receivers are at least partially recessed into the downhole tool.

Element 12: further including outputting the one or more acoustic or ultrasonic signals at an oblique angle toward the wellbore. Element 13: further including focusing a plurality of acoustic or ultrasonic signals output from the plurality of MEM transmitters to target a wellbore layer. Element 14: further including outputting the one or more acoustic or ultrasonic signals and detecting at least a portion of the one or more acoustic or ultrasonic signals multiple times while raising or lowering the downhole tool through the wellbore. Element 15: further including generating a map of the wellbore, a casing disposed within the wellbore, an annulus between the casing and a formation, or a combination thereof based on the property determined via the processing component. Element 16: further including determining whether fluid is present in an annulus between a casing of the wellbore and a formation, based on the property of the wellbore determined via the processing component. Element 17: further including maintaining the downhole tool at approximately the same orientation relative to a longitudinal axis of the downhole tool while determining the property of the wellbore around a full circumference of the wellbore. Element 18: further including scanning a wall of the wellbore by controlling a phase of the plurality of MEM transmitters outputting the one or more acoustic or ultrasonic signals.

Although the present disclosure and its advantages have been described in detail, it should be understood that various changes, substitutions and alterations can be made herein without departing from the spirit and scope of the disclosure as defined by the claims.

What is claimed is:

1. A system, comprising:
    a downhole tool;
    a plurality of microelectromechanical (MEM) transmitters disposed proximate an outer surface of the downhole tool for outputting one or more acoustic or ultrasonic signals toward a wellbore; and
    a plurality of MEM receivers disposed proximate the outer surface of the downhole tool for receiving a portion of the one or more acoustic or ultrasonic signals reflected back from the wellbore;
    wherein the plurality of MEM transmitters, the plurality of MEM receivers, or both are disposed in arrays, wherein the arrays are either:
        circular arrays, each circular array being positioned at a different circumferential location around the downhole tool, wherein each circular array comprises a plurality of MEM transmitters and/or MEM receivers that are: spaced from each other circumferentially around a center point of the circular array; and each located equidistant from the center point of the circular array; or
        rectangular arrays, each rectangular array being positioned at a different circumferential location around the downhole tool, wherein a space in a circumferential direction about the downhole tool between adjacent rectangular arrays is greater than a space in a circumferential direction between adjacent MEM transmitters and/or MEM receivers located in any one of the rectangular arrays.

2. The system of claim 1, wherein the plurality of MEM transmitters, the plurality of MEM receivers, or both are coupled directly to the outer surface of the downhole tool.

3. The system of claim 1, wherein the plurality of MEM transmitters, the plurality of MEM receivers, or both are mounted on mechanical arms that are selectively extendable away from the outer surface of the downhole tool.

4. The system of claim 1, wherein the plurality of MEM transmitters are disposed on a first circumferential band around the downhole tool, the plurality of MEM receivers are disposed on a second circumferential band around the downhole tool, and the first and second circumferential bands are offset along an axis of the downhole tool.

5. The system of claim 1, further comprising a protective coating disposed over one or more of the plurality of MEM transmitters and the plurality of MEM receivers.

6. The system of claim 1, wherein the plurality of MEM transmitters and the plurality of MEM receivers are at least partially recessed into the downhole tool.

7. A method, comprising:
    outputting one or more acoustic or ultrasonic signals toward a wellbore via a plurality of microelectromechanical (MEM) transmitters disposed proximate an outer surface of a downhole tool;
    detecting at least a portion of the one or more acoustic or ultrasonic signals reflected back from the wellbore via a plurality of MEM receivers disposed proximate the outer surface of the downhole tool;
    processing the detected portion of the one or more acoustic or ultrasonic signals to determine a property of the wellbore via a processing component communicatively coupled to the plurality of MEM receivers; and
    generating a 3-dimensional map of the wellbore, a 3-dimensional map of a casing disposed within the wellbore, or a cement bond log of cement in an annulus between the casing and a formation, based on the property determined via the processing component;
    wherein the plurality of MEM transmitters, the plurality of MEM receivers, or both are disposed in arrays, wherein the arrays are either:
        circular arrays, each circular array being positioned at a different circumferential location around the downhole tool, wherein each circular array comprises a plurality of MEM transmitters and/or MEM receivers that are: spaced from each other circumferentially around a center point of the circular array; and each located equidistant from the center point of the circular array; or rectangular arrays, each rectangular array being positioned at a different circumferential location around the downhole tool, wherein a space in a circumferential direction about the downhole tool between adjacent rectangular arrays is greater than a space in a circumferential direction between adjacent MEM transmitters and/or MEM receivers located in any one of the rectangular arrays.

8. The method of claim 7, further comprising outputting the one or more acoustic or ultrasonic signals at an oblique angle toward the wellbore.

9. The method of claim 7, further comprising focusing a plurality of acoustic or ultrasonic signals output from the plurality of MEM transmitters to target a wellbore layer.

10. The method of claim 7, further comprising outputting the one or more acoustic or ultrasonic signals and detecting at least a portion of the one or more acoustic or ultrasonic signals multiple times while raising or lowering the downhole tool through the wellbore.

11. The method of claim 7, further comprising determining whether fluid is present in an annulus between a casing of the wellbore and a formation, based on the property of the wellbore determined via the processing component.

12. The method of claim 7, further comprising maintaining the downhole tool at approximately the same orientation relative to a longitudinal axis of the downhole tool while determining the property of the wellbore around a full circumference of the wellbore.

13. The method of claim 7, further comprising scanning a wall of the wellbore by controlling a phase of the plurality of MEM transmitters outputting the one or more acoustic or ultrasonic signals.

14. The method of claim 7, wherein processing the detected portion of the one or more acoustic or ultrasonic signals comprises performing one or more array processing techniques on multiple acoustic or ultrasonic signals, the one or more array processing techniques being selected from the group consisting of: semblance-based imaging, beamforming, slant stacks, and vespagrams.

15. The method of claim 7, comprising generating the 3-dimensional map of the wellbore or the 3-dimensional map of a casing disposed within the wellbore.

16. The method of claim 7, wherein the plurality of MEM transmitters, the plurality of MEM receivers, or both are disposed in circular arrays, each circular array being positioned at a different circumferential location around the downhole tool, wherein each circular array comprises a plurality of MEM transmitters and/or MEM receivers that are: spaced from each other circumferentially around a center point of the circular array; and each located equidistant from the center point of the circular array.

17. The method of claim 7, wherein the plurality of MEM transmitters, the plurality of MEM receivers, or both are disposed in rectangular arrays, each rectangular array being positioned at a different circumferential location around the downhole tool, wherein a space in a circumferential direction about the downhole tool between adjacent rectangular arrays is greater than a space in a circumferential direction between adjacent MEM transmitters and/or MEM receivers located in any one of the rectangular arrays.

18. The method of claim 7, further comprising controlling a timing of the operation of the plurality of MEM transmitters and MEM receivers to collect multiple sets of measurements, and determining multiple different properties of the wellbore based on the multiple sets of measurements.

19. A system, comprising:

a downhole tool;

a plurality of microelectromechanical (MEM) transmitters disposed proximate an outer surface of the downhole tool for outputting one or more acoustic or ultrasonic signals toward a wellbore;

a plurality of MEM receivers disposed proximate the outer surface of the downhole tool for receiving a portion of the one or more acoustic or ultrasonic signals reflected back from the wellbore, wherein the plurality of MEM transmitters and the plurality of MEM receivers are randomly interspersed amongst each other on the downhole tool; and a controller communicatively coupled to the plurality of MEM transmitters and MEM receivers, wherein the controller controls a timing of the operation of the plurality of MEM transmitters and MEM receivers to collect multiple different downhole measurements using the same plurality of MEM transmitters and MEM receivers.

20. The system of claim 1, wherein the plurality of MEM transmitters, the plurality of MEM receivers, or both are disposed in a three-dimensional arrangement with respect to each other.

* * * * *